United States Patent [19]

Aufderheide et al.

[11] Patent Number: 4,926,007
[45] Date of Patent: May 15, 1990

[54] SHIELDED FLEXIBLE CONNECTOR AND PROCESS THEREFOR

[75] Inventors: Brian E. Aufderheide, Cedarburg; Gerald G. Hanauer, Mequon, both of Wis.

[73] Assignee: W. H. Brady Co., Milwaukee, Wis.

[21] Appl. No.: 318,580

[22] Filed: Mar. 3, 1989

[51] Int. Cl.$^5$ .................. H01B 7/34; H01B 7/08
[52] U.S. Cl. ............................. 174/36; 156/47; 156/51; 174/117 FF
[58] Field of Search ............ 174/36, 117 FF, 117 F; 156/47, 51; 427/117

[56] References Cited

U.S. PATENT DOCUMENTS

| | | | |
|---|---|---|---|
| 3,162,717 | 12/1964 | Lentz | 174/117 FF |
| 3,775,552 | 11/1973 | Schumacher | 174/36 X |
| 4,468,089 | 8/1984 | Brorein | 174/36 X |
| 4,481,379 | 11/1984 | Bolick, Jr. et al. | 174/117 F X |

*Primary Examiner*—Morris H. Nimmo
*Attorney, Agent, or Firm*—Quarles & Brady

[57] ABSTRACT

A flexible shielded connector is made by depositing a cover shield layer onto a base shield layer so as to provide direct mechanical and electrical contact along the side edge seams of the two shield layers. A metallic base shield layer is applied to a flexible substrate and a base layer of insulating material is applied on top of an interior area of the base shield layer. Side edge areas of the base shield layer on each side of the interior area are left exposed. At least one conductor is applied over the base insulating layer and a cover layer of insulating material is applied over the conductor, also leaving the side edge areas of the top of the base shield layer on each side of the interior area exposed. A metallic cover shield layer is then deposited over the cover layer of insulating material and extends over the side edge areas of the top of the base shield layer so as to envelope the base and cover layers of insulating material and the conductor by the base and cover shield layers. One or more channels in which the base and cover shield layers are in contact may also be provided between the conductors.

9 Claims, 8 Drawing Sheets

SHIELDED FLEXIBLE CONNECTOR AND PROCESS THEREFOR

BACKGROUND OF THE INVENTION

1. Field Of The Invention

This invention relates to a shielded flexible connector which is made by depositing electrically conductive layers on a film substrate.

2. Discussion Of The Prior Art

It is well known that in many applications where electrical conductors are needed, ambient electromagnetic signals (EMI) and/or ambient radio frequency signals (RFI) can interfere with the signal intended to be carried by the conductor. For example, this is the case for small signals such as those carried by antenna connectors, sensor connectors, print head connectors, liquid crystal display connectors, membrane switch connectors, and other connectors, particularly where the connected devices are vulnerable to noise (i.e. high impedance, low voltage and current devices).

It is also well known that electrical shielding is effective to reduce the noise caused by EMI and RFI. Where shielding is provided, the conductors are typically separated from the shielding by an insulator. In the prior art, shielding layers were applied over the insulator. When film substrates were used, the shielding was applied by adhesively laminating together two sheets of plastic film which each had a metallized layer. This resulted in somewhat less than 360° shielding around the conductors because the side edge areas of the metal layers were spaced apart by the thicknesses of the plastic films and adhesive layers, thereby creating a gap in the shielding at each of the side edges. EMI and RFI could leak in through these gaps and interfere with the performance of the connector.

SUMMARY OF THE INVENTION

The invention provides a flexible shielded connector which is made by depositing a cover shield layer onto a base shield layer so as to provide direct mechanical and electrical contact along the edge seams of the two shield layers. A base shield layer of an electrically conductive material is applied onto a flexible substrate and a base layer of insulating material is applied on top of an interior area of the base shield layer. Side edge areas of the base shield layer on each side of the interior area are left exposed. At least one conductor is applied over the base insulating layer and a cover layer of insulating material is applied over the conductor, also leaving the side edge areas of the top of the base shield layer on each side of the interior area exposed. A cover shield layer of electrically conductive material is then deposited over the cover layer of insulating material and extends over the side edge areas of the top of the base shield layer so as to envelope the base and cover layers of insulating material and the conductor by the base and cover shield layers. This provides an EMI, RFI shield for 360° around the conductor without any gaps or discontinuities.

In a preferred form, the base and cover insulating layers are applied so as to define an exposed channel area on the base shield layer between the exposed side edge areas. At least one conductor is applied between the base and cover insulating layers on each side of the channel, and the cover shield layer is deposited so as to contact the channel area. Thereby, the conductors on either side of the channel are shielded from each other as well as from external EMI, RFI signals.

It is therefore a principal object of the invention to provide a flexible shielded connector which has a shield for 360° around a conductor to reduce leakage of EMI and RFI signals.

It is another object of the invention to provide such a connector which can be made using metal deposition processes.

It is another object of the invention to provide such a connector which can be economically manufactured.

It is another object of the invention to provide such a connector which can be adapted to many different shield configurations.

These and other objects and advantages of the invention will become apparent from the detailed description and from the drawings.

DESCRIPTION OF THE DRAWINGS

The present invention is described below, as required by 35 U.S.C. §112, in such full detail as to enable those skilled in the art to practice the invention and also to set forth the presently-contemplated best modes for its practice, all by reference to the following drawings in which:

FIG. 1b is a bottom perspective view of the connector of FIG. 1a;

FIG. 2 is an exploded perspective view of the connector of FIG. 1a;

FIG. 3 is a schematic view of a machine for sputter vacuum depositing the metal layers of the connector of FIG. 1a;

DETAILED DESCRIPTION OF THE PREFERRED EMBODIMENT

One embodiment of an electrical connector 1 of the invention is illustrated in FIGS. 1a, 1b, 2, 20 and 21. FIGS. 4–19 illustrate various steps in the manufacture of the connector 1. Hereafter, the connector 1 as illustrated in the various stages of partial completion of FIGS. 4–19 is referred to as the "connector-in-process".

The connector 1 is a flexible ribbon having an outer boundary defined by a top surface 14 (FIG. 1a), a bottom surface 15 (FIG. 1b), side edges 16 and 17, and end edges 18 and 19. The connector 1 may be adapted to many different electrical applications, such as for antenna connectors, sensor connectors, print head connectors, liquid crystal display connectors, or membrane switch connectors. Since the connector 1 is shielded, it is especially adapted to high impedance, low voltage and current devices, which are susceptible to noise.

Figure 1A:
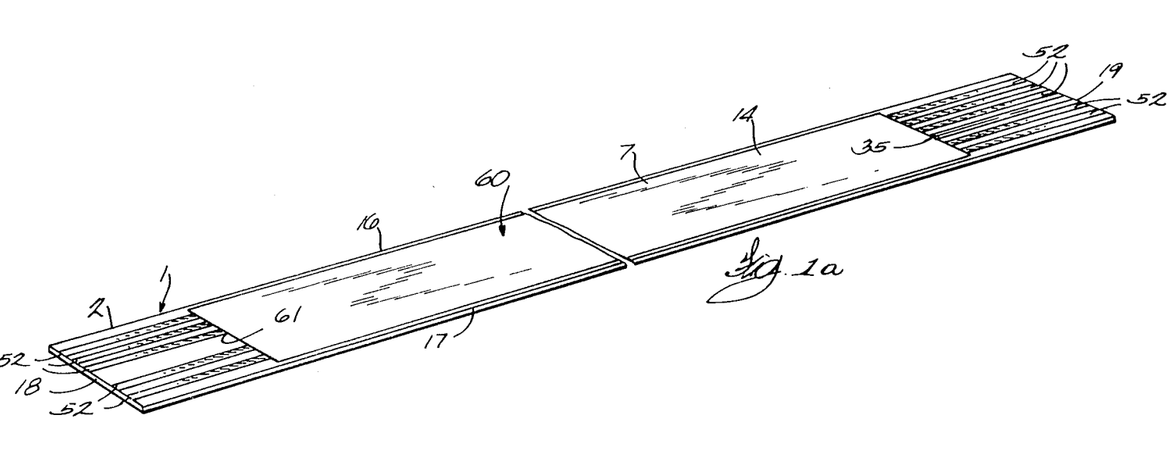
FIG. 1a is a top perspective view of a flexible shielded connector of the invention.
Figure 1B:
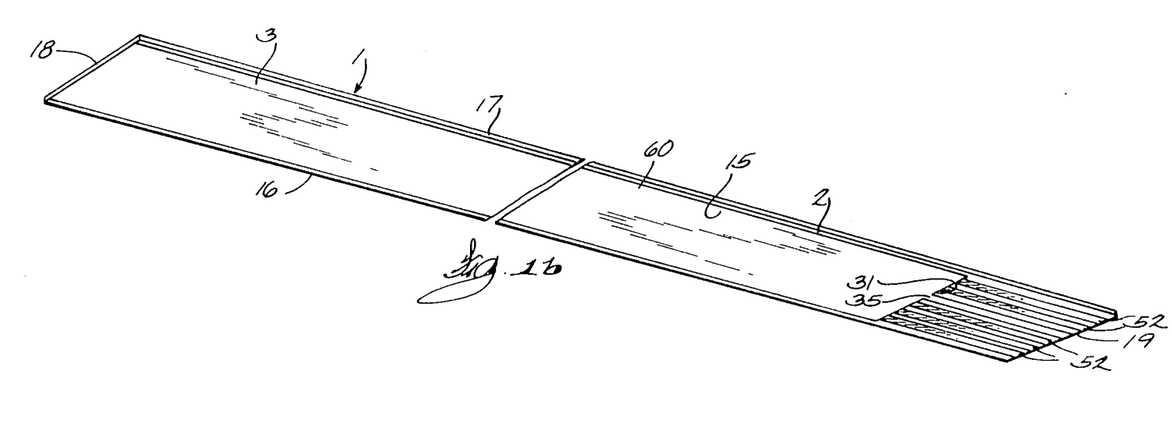
Figures 2, 3:
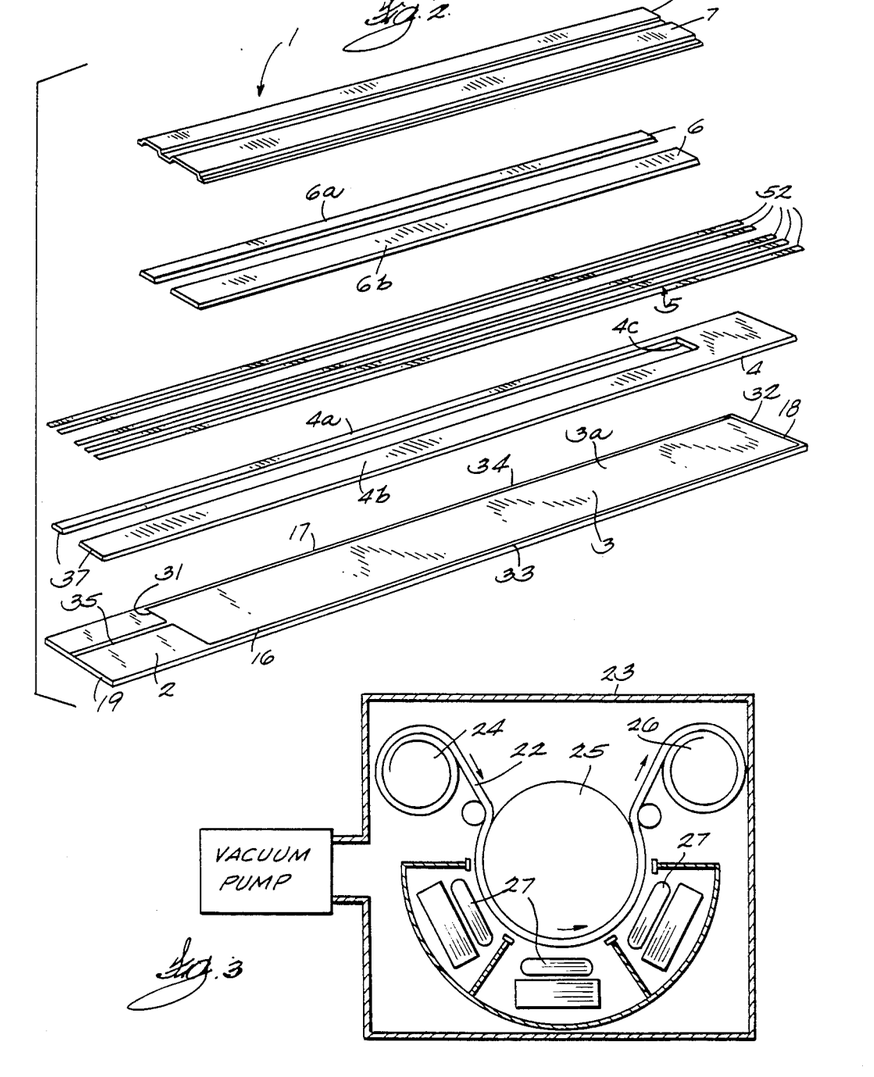

The connector 1 is made by depositing or otherwise applying a series of layers onto a flexible film substrate 2. Referring to FIG. 2, the layers in the preferred connector 1 include a base shield layer 3, a base insulating layer 4, a conductor layer 5, a cover insulating layer 6 and a cover shield layer 7. In FIGS. 1a and 1b, the substrate 2 and insulating layers 4 and 6 are shown as being transparent for clarity of illustration. Optional layers such as a protective layer 8 illustrated in FIG. 22 may also be provided over the cover shield layer 7 for scratch resistance, electrical insulation, or for other purposes, if desired.

The substrate 2 is preferably a flexible polymer film, although any material suitable as a substrate for bearing the layers hereinafter described may be used. Examples of commonly available suitable polymer films include polyimide, polyester, polyvinylidene fluoride, polycarbonate, polysulfone, polytetrafluoroethylene, and polyetherether ketone. The thickness of the substrate should allow sufficient strength and flexibility for the particular connector application. A thickness range of 0.002–0.005" is suitable for many applications. The width and length of the substrate 2 (and connector 1) may be any magnitude, being limited only by the application.

The first step in making the connector 1 is to deposit or otherwise apply the base shield layer 3 over the substrate 2. It is not necessary that the base shield layer 3 be applied directly over the substrate 2, as there could be intervening layers for other purposes such as insulating or conducting electricity, but in the embodiment illustrated, the base shield layer 3 is applied directly over the top surface of the substrate 2. In the connector 1, the bottom surface 15 of the substrate 2 is bare, although other layers could be provided on the bottom surface 15, if desired.

The base shield layer 3, and also the cover shield layer 7, are made of an electrically conductive material which is effective to shield against EMI and RFI. Common examples of materials which are effective for EMI, RFI shielding include copper, nickel, silver, aluminum, gold, chromium, indium tin oxide, tin oxide, constantan, stainless steel and nichrome.

The shield layers 3 and 7 may be deposited by any suitable deposition process which is compatible with the substrate 2 and the other layers 4, 5 and 6. It is not necessary that both layers be made by the same type of process. Suitable processes include sputtering vacuum deposition, evaporation, plating and printing. The thickness of the shield layers 3 and 7 is any suitable thickness to insure a uniformly dense, homogeneous, unbroken layer of material blanketing the entire area of the layer and to provide the requisite flexibility. A thickness of 50 Angstroms (0.000005 mm) to five micrometers (0.005 mm) should suffice for many applications.

Sputtering vacuum deposition is preferred to form the shield layers 3 and 7. Sputtering vacuum deposition is well known. Briefly, it is generically described as a deposition process in which a partial vacuum is drawn in a vacuum chamber and a small amount of an inert gas such as Argon is introduced into the chamber. A negative electric potential is then applied to a sputtering target metal which is contained within the vacuum chamber. This creates a plasma or glow discharge adjacent to the target through which the connector-in-process is passed. Positively charged gas ions generated in the plasma region are attracted to the negative potential at the target and propelled towards it at a very high velocity. Collisions between the positively charged gas ions and the target result in a momentum transfer to the target surface atoms and ejection of atomic sized particles out of the target. These particles traverse the space between the target and the connector-in-process and are deposited as a thin film on the connector-in-process. Additional information about sputter coating is widely available, such as in Thin Film Processes, Vossen & Kern, published by Academic Press, Inc., 1978, and in U.S. Pat. No. 4,740,385, which issued April 26, 1988 to Leybold Heraeus G.m.b.H.

Sputtering vacuum deposition produces a thin, high quality flexible electrically conductive layer having a uniform thickness in the transverse and longitudinal directions. Although other processes, such as evaporation, could be used to deposit the electrically conductive layers in a connector of the invention, sputtered layers in comparison are extremely dense, have good electrical properties, and adhere well to the underlying materials.

The preferred sputter coating process for depositing the shield layers 3 and 7 is schematically illustrated in FIG. 3. This is a known process which is practiced by sputter roll coating equipment which is commercially available from Leybold Heraeus G.m.b.H., Cologne, Fed. Rep. of Germany, under the designation Type A-550-B-5-Z3R. Briefly, the process illustrated is a continuous or roll to roll thin film manufacturing process. A web 22 of connectors-in-process, typically comprised of multiple connectors-in-process end-to-end and side-by-side in a single web, is supplied from a supply roll 24. The web 22 is wound around a chill drum 25 and then wound onto a take-up roll 26. Three target stations 27 are positioned around the chill drum 25. The rolls 24, 26, drum 25 and targets 27 are all held within a vacuum chamber 23 in which a partial vacuum is drawn. The target stations 27 each provide one coat of target material for each shield layer deposited, for a total of three coats per layer, to provide a uniformly dense layer in the final connector 1.

As mentioned above, although the connector 1 may be relatively narrow, multiple connectors 1 may be processed in a single web many times wider and longer than a single connector. After all of the coating processes are complete, the web may be cut into individual connectors. For example, the sputter roll coater identified above can coat a web which is 550 mm wide, which is sufficiently wide to simultaneously coat at least 36 approximately 13 mm wide connectors 1 in side by side relation in a single web.

In the preferred process, the entire area of the connector-in-process which is exposed to the targets 27 is coated. However, as best shown in FIG. 2, the base shield layer 3 is deposited within a certain pattern which covers less than the entire area of the substrate 2. This is made possible by coating the areas of the substrate 2 which are not to be metallized (hereafter the "negative" areas) by the base shield layer 3 with a soluble undercoating 30. Suitable soluble undercoatings 30 and the process of using them are fully described in U.S. Pat. No. 4,714,631, entitled "Rapidly Removeable Undercoating For Vacuum Deposition of Patterned Layers Onto Substrates", issued Dec. 22, 1987 and assigned to the assignee of this application. The use of this undercoating allows patterned deposition, and is more fully described below in connection with the other patterned conductive layers.

Figure 4:
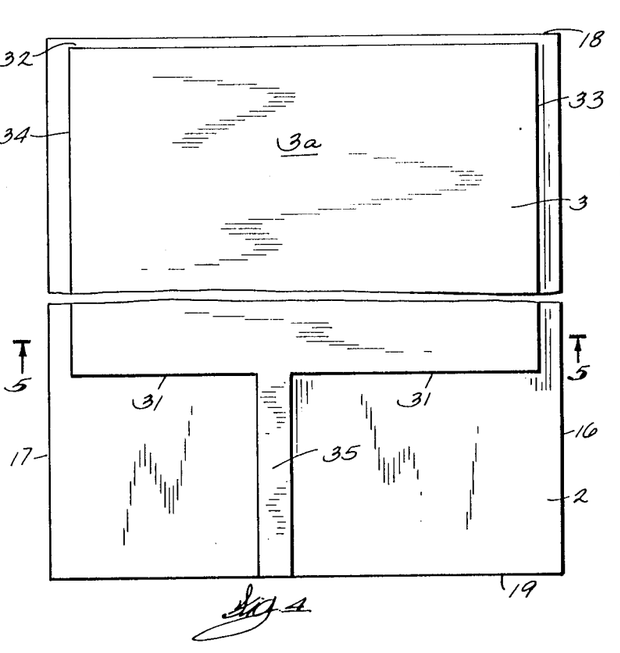
FIG. 4 is a top plan view of a connector-in-process of the invention after a first production step.
Figure 5:
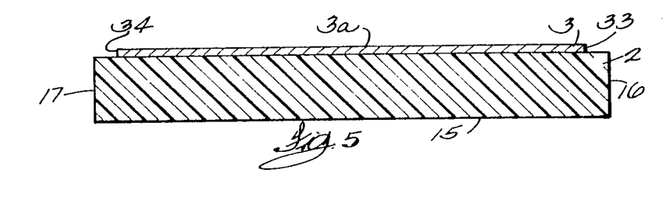
FIG. 5 is a sectional view taken along the plane of the line 5—5 of FIG. 4.

FIGS. 2, 4 and 5 illustrate the base shield layer 3 deposited on top of the substrate 2 just prior to the application of the base insulating layer 4. The base shield layer 3 includes a top or first surface 3a and is bounded by end edges 31 and 32 and side edges 33 and 34 on the substrate 2. The layer 3 also has a tab 35 extending from end 31 for grounding the shield layers 3 and 7, as further described below. For clarity of illustration throughout the drawings, the thicknesses of the various layers have been exaggerated and are not to scale.

Figure 6:
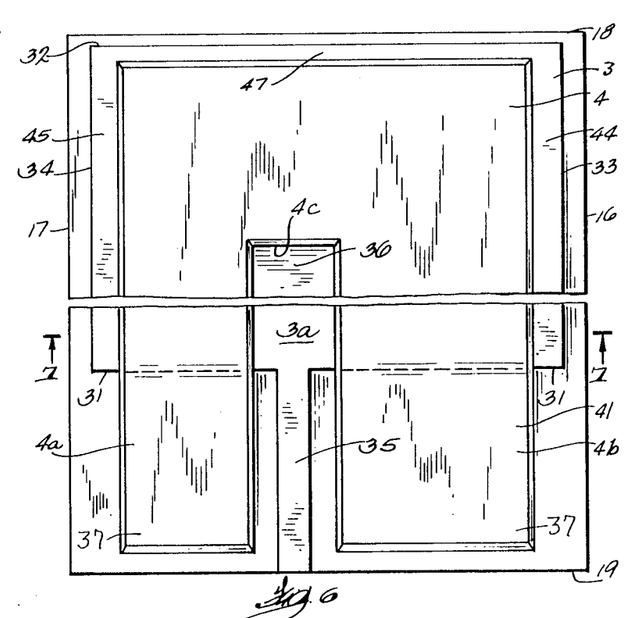
FIG. 6 is a top plan view of a connector-in-process of the invention after a second production step.
Figure 7:
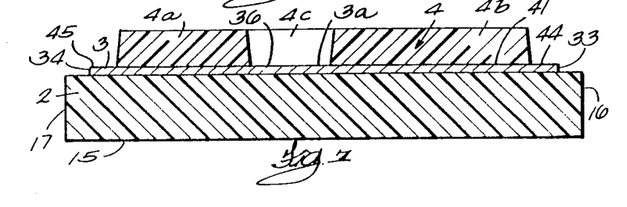
FIG. 7 is a sectional view taken along the plane of the line 7—7 of FIG. 6.

The connector-in-process after the base insulating layer 4 has been applied is shown in FIGS. 6 and 7. After the base shield layer 3 is deposited, the base insulating layer 4 is applied over a portion of first surface 3a of the base shield layer 3 and substrate 2. Referring to FIGS. 2 and 6, the base insulating layer 4 is in an elongated U-shape, having two legs 4a and 4b and a crotch 4c where the legs 4a and 4b meet. The leg 4a of the layer 4 is somewhat narrower than the leg 4b. Free ends 37 of the legs 4a and 4b extend past the end 31 of the base shield 14 on both sides of the tab 35.

As best shown in FIGS. 6 and 7, the base insulating layer 4 defines on the base shield layer 3 an interior insulated area 41 over which the base insulating layer 4 lies, longitudinally extending uninsulated areas 44 and 45 along each side edge 33 and 34 of the base shield layer 3, and a transverse uninsulated area 47 at end 32 of base shield layer 3. The legs 4a and 4b define between them an uninsulated longitudinal channel 36 on the base shield layer 3. The uninsulated areas 36, 44, 45 and 47 of first surface 3a of the base shield layer 3 are not covered by the base insulating layer 4 and therefore are exposed.

The base insulating layer 4 is applied in any desired pattern by any suitable coating or printing process. In the preferred embodiment, screen printing is employed. To insure a uniform thickness of insulator devoid of any craters or discontinuities over the entire area of the base insulating layer 4, the layer 4 may be applied using multiple coats of insulating material.

Any suitable electrical insulator may be used for the base insulating layer 4. Examples of polymer insulating materials which may be used include epoxies, polyimides, acrylics, polyesters and urethanes. The thickness and material of the insulating layer is determined by the electrical requirements of the connector. A typical thickness would be 0.001". It would also be possible to use a laminated film insulator in a connector of the invention.

Figures 8, 9:
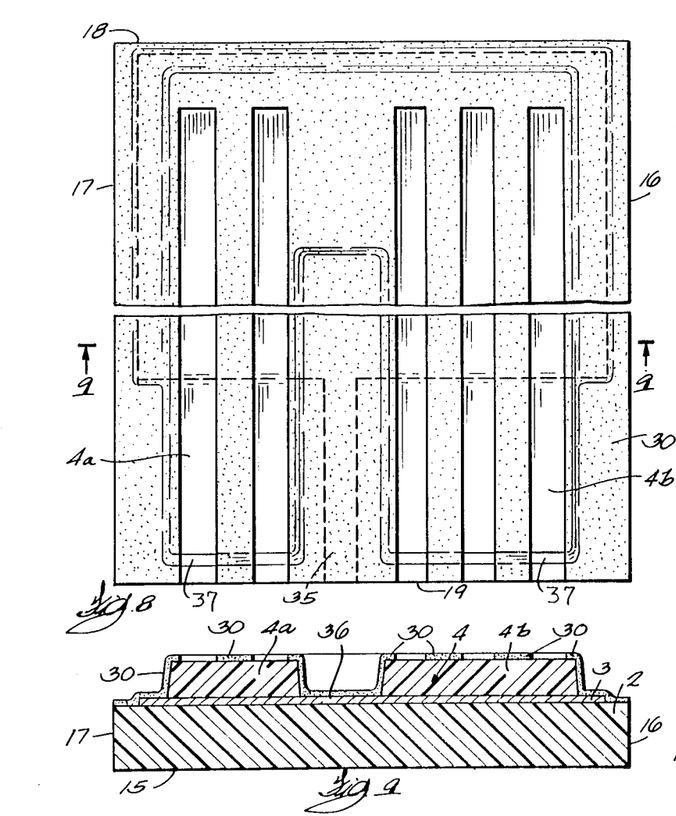
FIG. 8 is a top plan view of a connector-in-process of the invention after a third production step.
FIG. 9 is a sectional view taken along the plane of the line 9—9 of FIG. 8.

FIGS. 8 and 9 illustrate the next step of the process of making the connector 1. In this step, the soluble undercoating 30 is applied over portions of the base insulating layer 4, the base shield layer 3 and the substrate 2 to prepare the connector-in-process for the application of the conductor layer 5. The undercoating 30 is applied over all areas on the top of the connector-in-process except where conductors 52 which are deposited in layer 5 in the final connector 10 are not to be deposited. The undercoating 30 may be applied by screen printing or other suitable processes to coat the negative of the conductor 52 areas.

Figures 10, 11:
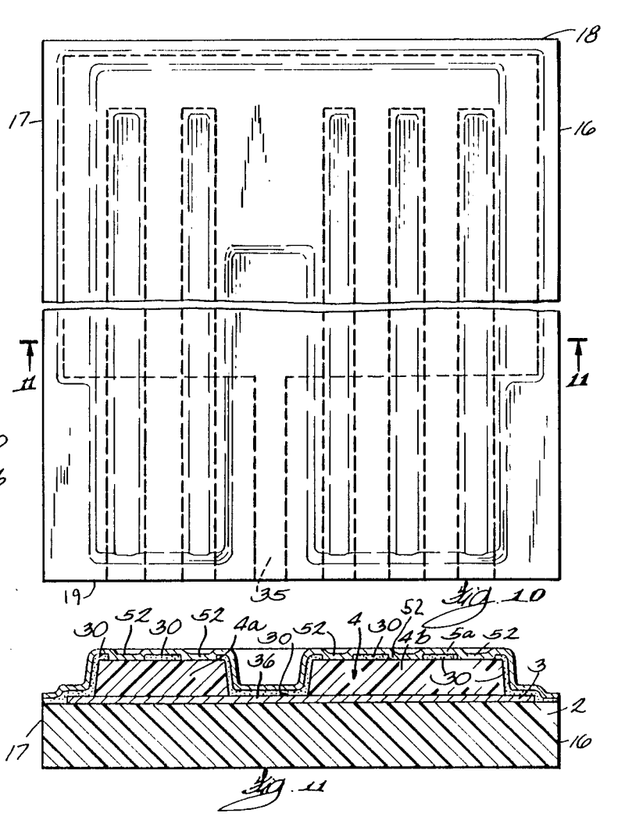
FIG. 10 is a top plan view of a connector-in-process of the invention after a fourth production step.
FIG. 11 is a sectional view taken along the plane of the line 11—11 of FIG. 10.
Figure 12:
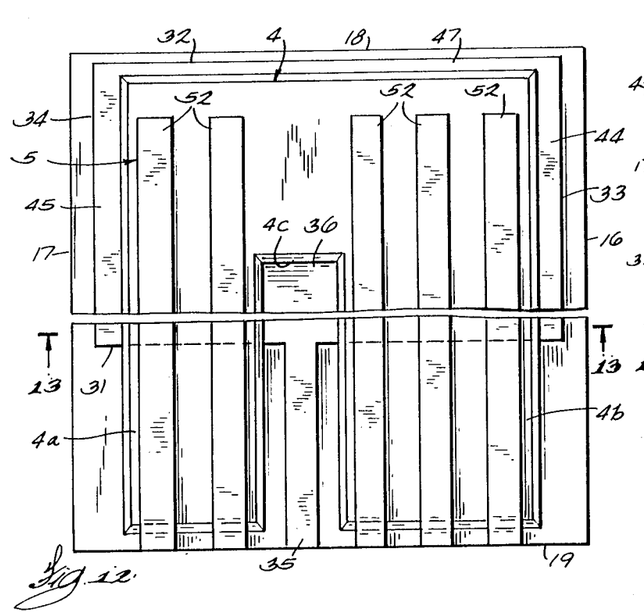
FIG. 12 is a top plan view of a connector-in-process of the invention after a fifth production step.
Figure 13:
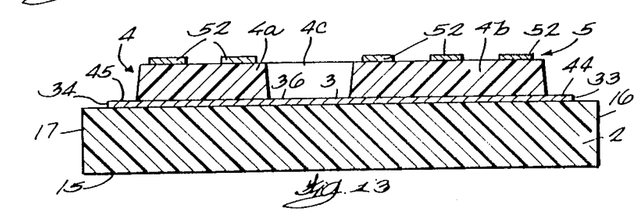
FIG. 13 a sectional view taken along the plane of the line 13—13 of FIG. 12.

As shown in FIGS. 10 and 11, the conductor layer 5 is sputter deposited as described above over the connector-in-process. The sputtering process covers the areas of the undercoating 30 as well as the conductor 52 areas with an electrically conductive layer 5a. The undercoating 30 is then washed off and the connector-in-process which results is shown in FIGS. 12 and 13. The result is five longitudinally running conductors 52 which are substantially parallel to the side edges of the base shield layer 3. At the end 19, the conductors 52 may extend past the end of the base insulating layer 4 as shown since the base shield layer 3 terminates short of where the base insulating layer 4 terminates.

There can be any number of conductors 52 (at least one) provided in a connector of the invention. Moreover, conductors 52 can be formed in a connector of the invention by techniques other than sputter deposition, such as by evaporation deposition or plating as previously mentioned, or by printing them with a conductive ink or using preformed conductors.

Figure 14:
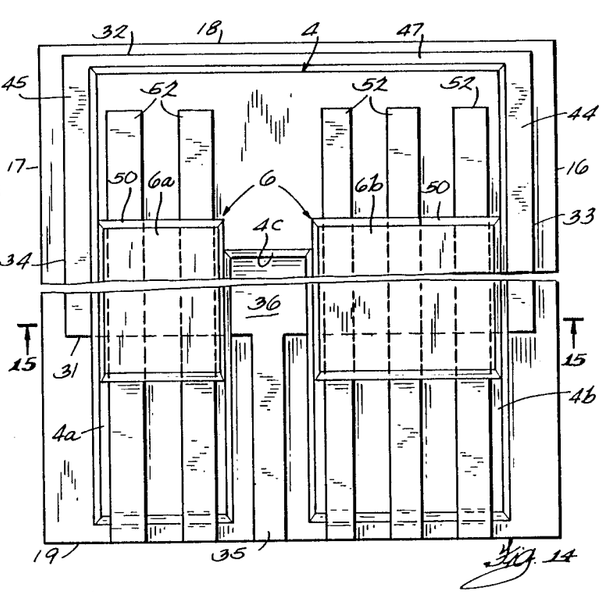
FIG. 14 is a top plan view of a connector-in-process of the invention after a sixth production step.
Figure 15:
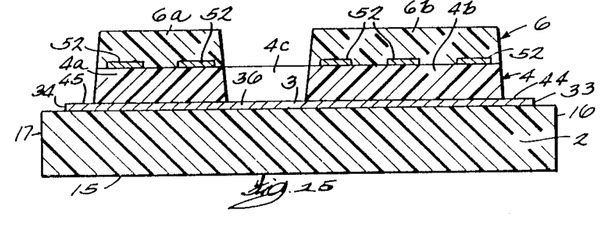
FIG. 15 a sectional view taken along the plane of the line 15—15 of FIG. 14.

FIGS. 14 and 15 illustrate the connector-in-process after the next step has been accomplished. In this step, the cover insulating layer 6 is applied over the interior portions of the conductors 52 and base insulating layer 4, The cover insulating layer 6 may be applied in the same manner and to the same thickness as the base insulating layer 4, described above. The cover insulating layer 6, comprised of two pads 6a and 6b of insulating material, would usually not be applied over the end portions of the conductors 52 to keep the end portions exposed for connection to electrical devices or circuits in the finished connector 1. The cover insulating layer 6 also does not cover the exposed areas 36, 44, 45 (or 47) of the base shield layer 3. Ends 50 of the pads 6a and 6b extend somewhat beyond the crotch 4c of the base insulating layer 4.

Figure 16:
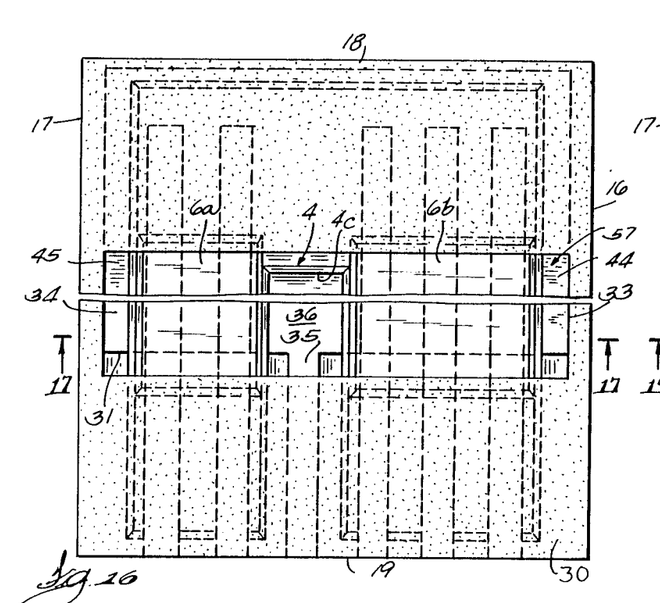
FIG. 16 a top plan view of a connector-in-process of the invention after a seventh production step.
Figure 17:
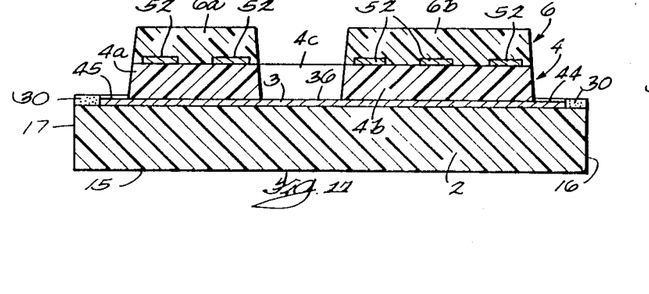
FIG. 17 is a sectional view taken along the plane of the line 17—17 of FIG. 16.

The next step of the process of making the connector 1 is to apply undercoating 30 to the negative of the area where the cover shield layer 7 is to be applied. The applied undercoating 30 is shown in FIGS. 16 and 17. This covers the entire top side of the connector-in-process except for area 57, which is where the cover shield layer 7 is to deposited. This area is as wide as the base shield layer 3 so that it extends out over the uninsulated areas 44 and 45 and bridges the channel 36. The area 57 is somewhat shorter than the length of the cover insulating layer 6 so that its ends stop somewhat short of the ends of the cover insulating layer 6. This insures that the cover insulating layer 6 will be effective to insulate the cover shield layer 7 from the conductors 52.

Figure 18:
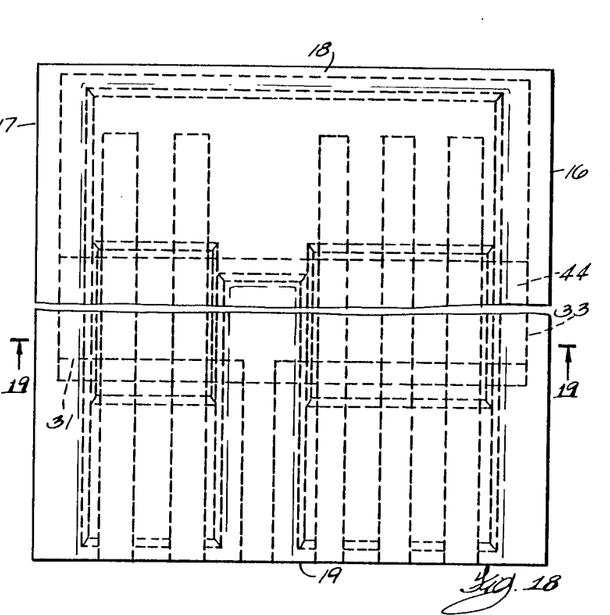
FIG. 18 is a top plan view of a connector-in-process of the invention after an eighth production step.
Figure 19:
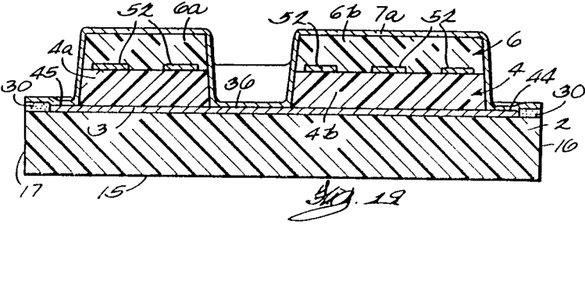
FIG. 19 is a sectional view taken along the plane of the line 19—19 of FIG. 18.

FIGS. 18 and 19 illustrate the connector-in-process after cover shield layer 7a has been sputter vacuum deposited as described above but before the undercoating 30 and excess areas of the layer 7a over the undercoating 30 have been washed away. The layer 7a may be deposited by the same techniques described above as for the base shield layer 3.

Figure 20:
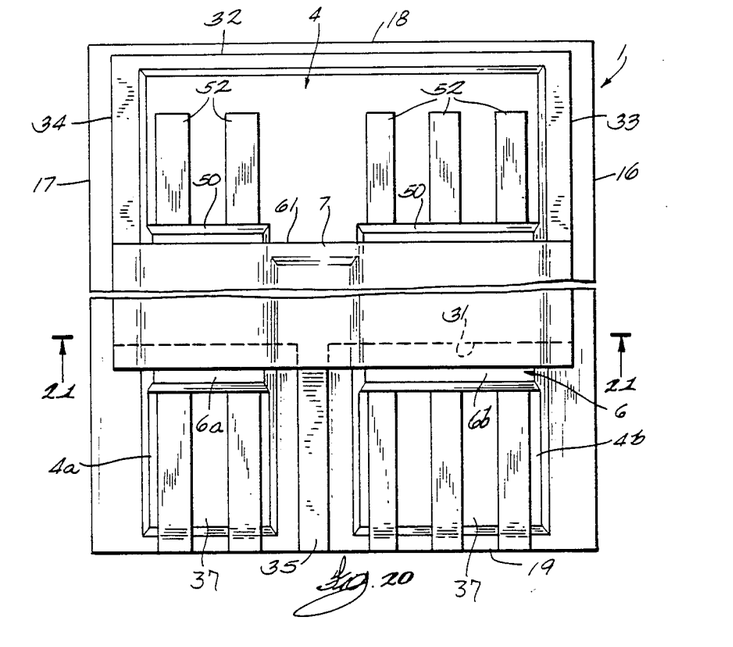
FIG. 20 is a top plan view of a connector-in-process of the invention after a ninth production step.
Figure 21:
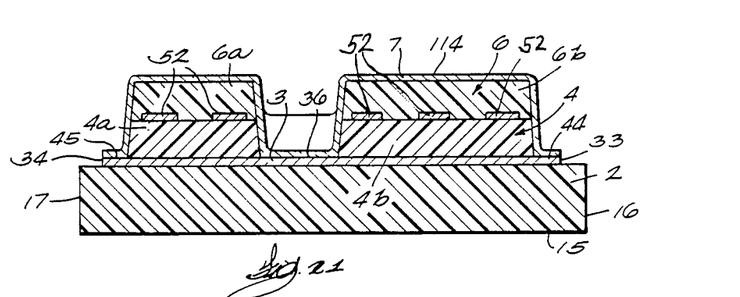
FIG. 21 is a sectional view taken along the plane of the line 21—21 of FIG. 20.
Figure 22:
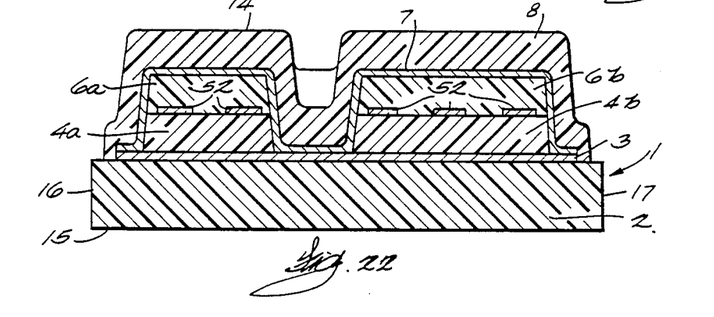
FIG. 22 is a sectional view similar to FIG. 21 but showing the connector with an optional protective coating.

Washing away the undercoating 30 and the excess areas of the layer 7a over the undercoating 30 defines the cover shield layer 7. FIGS. 20 and 21 illustrate a finished connector 1 after the undercoating 30 and excess areas of the shield layer 7a have been removed. FIG. 22 illustrates a finished connector 1, but also having the protective coating 8, which may be applied in any suitable coating process, such as screen printing, in a manner similar to the application of the insulating layers 4 and 6.

The conductors 52 are insulated from the base shield layer 3 by the base insulating layer 4 and are insulated from the cover shield layer 7 by the cover insulating layer 6. Thus, the conductors 52 are electrically isolated from the shield layers 3 and 7.

The combination of the base shield layer 3 and cover shield layer 7 defines a shielded portion 60 of the connector 1. The shielded portion 60 is the portion of the connector 1 where the shield layers 3 and 7 overlap, which extends from end edge 31 of base shield layer 3 (FIG. 1b) to end edge 61 of cover shield layer 7 (FIG. 1a). For this length of the connector 1, the conductors 52 are enclosed by a 360° shield provided by the base shield layer 3 and cover shield layer 7.

The base shield layer 3 and the cover shield layer 7 are in longitudinally continuous electrical and mechanical contact with one another along the side areas 44 and 45 in the shielded portion 61 of the connector 1. By "longitudinally continuous", it is meant that the seam formed by the facing side edge areas of the base shield layer 3 and cover shield layer 7 is uninterrupted for the length of the shielded portion 61. The base shield layer 3 and cover shield layer 7 thereby form an unbroken shield for 360° around the conductors 52 in a plane which is substantially normal to the conductors 52. By being in direct contact, the side edge areas of the shield layers 3 and 7 prevent the leakage of EMI and RFI which may otherwise interfere with the signals carried by the conductors 52.

In the particular connector 1, the base shield layer 3 and cover shield layer 7 are also in electrical and mechanical contact in the channel area 36. This, in effect, creates two separate shields with the base shield layer 3 and cover shield layer 7. One of the shields thereby created shields the three conductors 52 between insulating leg 4b and pad 6b and the other of them shields the two conductors 52 between insulating leg 4a and pad 6a. This may be desirable in applications where one set of conductors should be shielded from another set of conductors. It should be apparent that any number of channels 36 could be provided, with the same effect.

It is usually desirable to ground the shield. For this purpose, the base shield layer 3 is provided with the extending tab 35 which may be connected to a suitable ground. Since the base shield layer 3 is electrically connected to the cover shield 56, this also grounds the cover shield layer 7.

The conductors 52 extend out from underneath the cover insulating layer 6 so that each has a bare portion at each end which may be connected to an electrical circuit or device. The exposed portions of the conductors 52 may, of course, be formed in any desired pattern to facilitate making connections or to allow surface mounting of devices.

Figure 23:
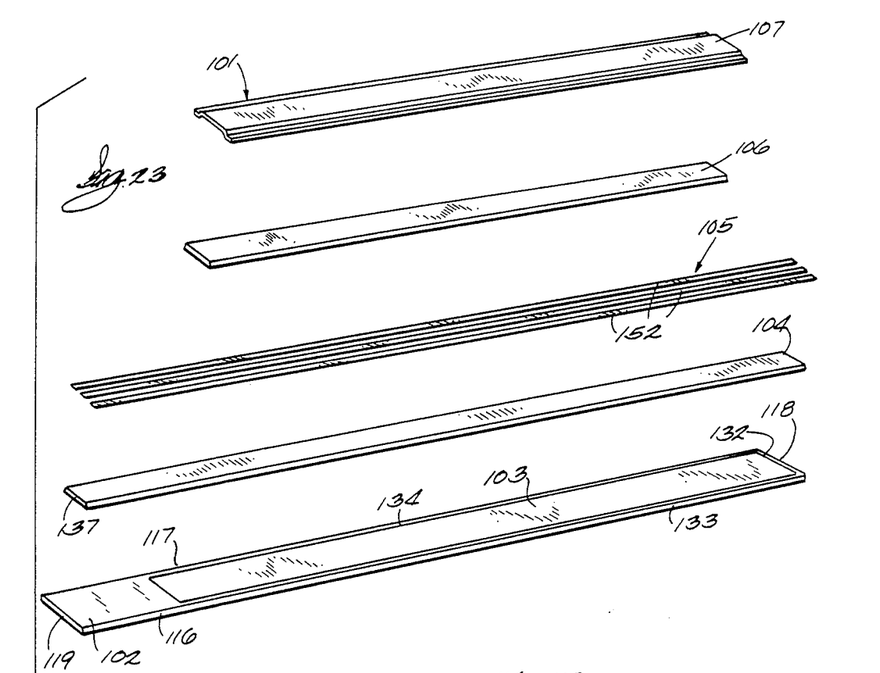
FIG. 23 is an exploded perspective view of a second embodiment of a connector of the invention.
Figure 24:
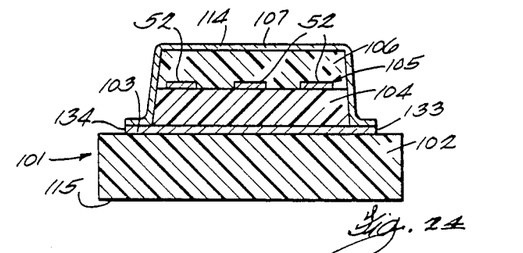
FIG. 24 is a sectional view similar to FIG. 21 of the connector of FIG. 23.

FIGS. 22 and 23 illustrate a second embodiment of a connector 101 of the invention. Elements corresponding to those of the connector 1 have been labeled in the connector 101 by the reference number of the part in the connector 1 plus 100. The connector 101 has a substrate 102, a base shield layer 103, a base insulating layer 104, a conductor layer 105 including three conductors 152, a cover insulating layer 106 and a cover shield layer 107. The connector 101 may be constructed basically the same as the connector 1, except that the center channel 36 has been eliminated so that the shield layers 103 and 107 form only one 360° shield.

EXAMPLE

A connector of the invention was made substantially in the form of the connector 1, described above, including the protective layer 8. In this connector, the substrate 2 was a polyester film approximately 13 mm wide, 483 mm long and 0.075 mm thick. The base shield layer 3, cover shield layer 7, and the conductor layer 5 were all made of copper which was sputter vacuum deposited as described above to a thickness of approximately 5000 Angstroms (0.0005 mm). The undercoating 30 used in the pattern metallization process was of the following formulation:

| | |
|---|---|
| Water soluble film-forming polymer (Polyvinyl alcohol with an average molecular weight of 3000-Monsanto Gelvatol 40-20 TM) | 70 gms |
| Solubility accelerator (Dextrose) | 70 gms |
| Solid particulate (Silica-PPG Ind. Lovel 28 TM) | 40 gms |
| Defoamer (Byk-Mallinckrodt U.S.A., Inc. Byk O 20 TM) | 0.66 gms |
| Deionized water | 210 gms |
| Solvent (Propylene glycol monomethyl ether) | 150 gms |

Further details about the undercoating 30 are available in U.S. Pat. No. 4,714,631, referred to above. The above formulation is most like the formulation of Example 6 of U.S. Pat. No. 4,714,631, with only a change in solvents to speed drying of the printed undercoating and the addition of a defoamer to reduce bubbles during printing.

An amine-cured clear epoxy coating was used for the insulating layers 4 and 6 and also for the protective layer 8. The particular coating consisted of two parts as follows:

| | Wt. % |
|---|---|
| Part A | |
| D.E.R. 671-XM75 TM (Dow Corning Bisphenol A type solid epoxy resin solution in 65% Methyl Isobutyl Ketone, | 75.1 |

-continued

| | Wt. % |
|---|---|
| 35% Xylene. Epoxide equivalent wt. of 425-550 based on resin solids.) | |
| Xylene | 8.3 |
| Methyl Isobutyl Ketone | 11.7 |
| D.C. 840 TM (Dow Corning flow control agent) | 0.5 |
| Part B | |
| D.E.H. 20 TM (Dow Corning Diethylene triamine epoxy curing agent) | 2.7 |
| Xylene | 1.7 |

This coating was screen printed in two coats to provide a thickness of 0.001" for each of the insulating layers 4 and 6, and for the protective layer 8. After application, each coat was cured at 200° Farhrenheit for 25 minutes.

The best mode contemplated by the inventors named herein of carrying out a connector of the invention has now been described in such full, clear and concise terms as to enable one of ordinary skill in the art to practice the invention. This connector has a shielded portion in which an electrically conductive shield comprised of a base layer and a cover layer surrounds insulation and conductor layers. The shield layers are deposited and the insulation and conductor layers made so as to join the edge areas of the two shield layers in direct, longitudinally continuous contact with one another. This seals out leakage of EMI and RFI at the edges, which may otherwise interfere with the performance of the conductors.

Although this invention has been illustrated and described by reference to specific embodiments, the invention is not intended to be defined as limited to those embodiments, but is defined by the claims which follow according to applicable law.

We claim:

1. A flexible connector having a shielded portion, said connector comprising:
    a flexible film substrate;
    a base shield layer of an electrically conductive material on a surface of the substrate and including a first surface, side edges and end edges, said first surface of said base shield layer having an interior insulated area and an extending uninsulated area along each side edge for the length of the shielded portion of the connector;
    a base insulating layer over the interior insulated area of the first surface of the base shield layer, said base insulating layer comprising an electrically insulating material;
    a conductor layer including at least one electrical conductor extending through the shielded portion of the connector over at least a portion of the base insulating layer, said conductor being spaced apart and electrically insulated from the base shield layer by the base insulating layer;
    a cover insulating layer extending for the shielded portion of the connector over at least a portion of the conductor layer and inside of the extending uninsulated areas along the side edges of the base shield layer; and
    a cover shield layer of an electrically conductive material deposited over at least a portion of the cover insulating layer and being spaced apart and electrically insulated from the conductor layer by the cover insulating layer, said cover shield layer extending over the uninsulated areas along the side edges of the base shield layer to be in electrical and mechanical contact with said uninsulated areas for the length of the shielded portion of the connector;
    wherein the base shield layer and the cover shield layer provide continuous shielding of the conductor against EMI and RFI for 360° around the conductor in a plane which is substantially normal to the flow of current through the conductor for the length of the shielded portion of the connector.

2. A connector as in claim 1, wherein the conductor layer includes two or more longitudinal conductors, a longitudinal channel separates the conductors into at least two sets of conductors, and the shield layers are in longitudinally continuous mechanical and electrical contact with one another in the channel thereby separately shielding each set of conductors between the channel and the edge area adjacent to the set.

3. A connector as in claim 1, further comprising a protective layer over one of the shield layers.

4. A connector as in claim 1, wherein one of said shield layers includes means for grounding both of said shield layers.

5. A connector as in claim 1, wherein the shield layers are applied by sputter vacuum deposition.

6. A flexible connector as in claim 5, wherein the conductor layer is applied by sputter vacuum deposition.

7. A connector as in claim 1, wherein the conductor has end portions extending outside of the shielded portion of the connector to make electrical connections.

8. A method of making a flexible connector having a shielded portion, said method comprising the steps of:
    applying a base shield layer of an electrically conductive material onto a flexible substrate;
    applying a base layer of insulating material on top of an interior area of the base shield layer while leaving a longitudinal side edge area of the top of the base shield layer on each side of the interior area exposed for the length of the shielded portion of the connector;
    applying over the base layer of insulating material at least one electrical conductor extending for at least the length of the shielded portion of the connector;
    applying a cover layer of insulating material over the conductor while leaving the longitudinal side edge areas of the top of the base shield layer on each side of the interior area exposed; and
    depositing a cover shield layer of electrically conductive material over the cover layer of insulating material and extending over the side edge areas of the top of the base shield layer so as to envelope the base and cover layers of insulating material and the conductor by the base and cover shield layers for the length of the shielded portion of the connector.

9. A method as is claim 8, wherein (a) the base and cover insulating layers are applied so as to define an exposed channel area on the base shield layer between the exposed side edge areas, (b) at least one conductor is applied between the base and cover insulating layers on each side of the channel, and (c) the cover shield layer is deposited so as to contact the channel area, thereby shielding the conductors on both sides of the channel.

* * * * *